(12) United States Patent
Hirano et al.

(10) Patent No.: US 10,396,244 B2
(45) Date of Patent: Aug. 27, 2019

(54) NITRIDE SEMICONDUCTOR LIGHT EMITTING ELEMENT

(71) Applicant: Soko Kagaku Co., Ltd., Ishikawa (JP)

(72) Inventors: Akira Hirano, Aichi (JP); Cyril Pernot, Aichi (JP); Tetsuhiko Inazu, Aichi (JP)

(73) Assignee: SOKO KAGAKU CO., LTD., Aichi (JP)

( * ) Notice: Subject to any disclaimer, the term of this patent is extended or adjusted under 35 U.S.C. 154(b) by 641 days.

(21) Appl. No.: 15/113,014

(22) PCT Filed: Jan. 21, 2014

(86) PCT No.: PCT/JP2014/051100
§ 371 (c)(1),
(2) Date: Jul. 20, 2016

(87) PCT Pub. No.: WO2015/111134
PCT Pub. Date: Jul. 30, 2015

(65) Prior Publication Data
US 2017/0077351 A1 Mar. 16, 2017

(51) Int. Cl.
*H01L 33/32* (2010.01)
*H01L 33/00* (2010.01)
(Continued)

(52) U.S. Cl.
CPC ............ *H01L 33/32* (2013.01); *H01L 33/007* (2013.01); *H01L 33/0025* (2013.01);
(Continued)

(58) Field of Classification Search
None
See application file for complete search history.

(56) References Cited

U.S. PATENT DOCUMENTS

2005/0001223 A1   1/2005   Linder et al.
2005/0093016 A1   5/2005   Yamamoto et al.
(Continued)

FOREIGN PATENT DOCUMENTS

JP   2002280610        9/2002
JP   2005503043 A      1/2005
(Continued)

OTHER PUBLICATIONS

Lee et al., "Development of Chip Separation Technique for InGaN-Based Light Emitting Diodes," IEEE J. of Quantum Electronics 47(12), Dec. 2011, 6 pages.
(Continued)

*Primary Examiner* — Minh Loan Tran
(74) *Attorney, Agent, or Firm* — Haynes Beffel & Wolfeld LLP

(57) ABSTRACT

A nitride semiconductor light emitting element comprises a sapphire substrate, and a light emitting element structure portion that has a plurality of nitride semiconductor layers formed on the sapphire substrate. The nitride semiconductor light emitting element is a back-surface-emitting type nitride semiconductor light emitting element that outputs light from the light emitting element structure portion to an outside of the element through the sapphire substrate. The nitride semiconductor light emitting element is divided into a chip whose planarly-viewed shape is a square or a rectangle. A thickness of the sapphire substrate is 0.45 to 1 times an average length of sides of the planarly-viewed shape of the chip.

10 Claims, 17 Drawing Sheets

(51) Int. Cl.
  *H01L 33/06* (2010.01)
  *H01L 33/16* (2010.01)
  *H01L 33/36* (2010.01)
  *H01L 33/20* (2010.01)

(52) U.S. Cl.
  CPC .......... *H01L 33/0095* (2013.01); *H01L 33/06* (2013.01); *H01L 33/16* (2013.01); *H01L 33/0079* (2013.01); *H01L 33/20* (2013.01); *H01L 33/36* (2013.01)

(56) References Cited

U.S. PATENT DOCUMENTS

| | | |
|---|---|---|
| 2005/0156185 A1 | 7/2005 | Kim et al. |
| 2008/0070380 A1 | 3/2008 | Kusunoki |
| 2008/0123711 A1 | 5/2008 | Chua et al. |
| 2009/0057646 A1* | 3/2009 | Hirayama ............ H01L 21/0237 257/13 |
| 2010/0233835 A1 | 9/2010 | Kusunoki |
| 2012/0074441 A1* | 3/2012 | Seo ....................... H01L 27/153 257/91 |
| 2013/0069104 A1* | 3/2013 | Ichikawa ............ H01L 33/0079 257/99 |
| 2013/0095581 A1 | 4/2013 | Lee et al. |

FOREIGN PATENT DOCUMENTS

| | | |
|---|---|---|
| JP | 2005109432 A | 4/2005 |
| JP | 2005142278 A | 6/2005 |
| JP | 2005210051 A | 8/2005 |
| JP | 2005213075 A | 8/2005 |
| JP | 2008053263 A | 3/2008 |
| JP | 2008066727 A | 3/2008 |
| JP | 2008078440 A | 4/2008 |
| JP | 2009054780 A | 3/2009 |
| JP | 2010199603 A | 9/2010 |
| JP | 2011071444 A | 4/2011 |
| JP | 2012023249 A | 2/2012 |
| JP | 2014007179 A | 1/2014 |
| WO | 2011007816 A1 | 1/2011 |

OTHER PUBLICATIONS

Lee et al., "High brightness GaN-based flip-chip light-emitting diodes by adopting geometric sapphire shaping structure," Semicond. Sci. Technol., 23, Jan. 10, 2008, pp. 1-5.
Steigerwald et al., "Illumination With Solid State Lighting Technology", IEEE Journal on Selected Topics in Quantum Electronics, Apr. 2002, vol. 8, No. 2, Mar./Apr. 2002, pp. 310-319.
Shatalov et al., "Large Chip High Power Deep Ultraviolet Light-Emitting Diodes", Applied Physics Express, 3, May 28, 2010, pp. 1-3.

* cited by examiner

NITRIDE SEMICONDUCTOR LIGHT EMITTING ELEMENT

TECHNICAL FIELD

The present invention relates to a nitride semiconductor light emitting element that is divided into an individual chip in which a light emitting element structure portion having a plurality of nitride semiconductor layers is formed on a sapphire substrate. In particular, the present invention relates to a back-surface-emitting type nitride semiconductor light emitting element that outputs light from an active layer to the outside of the element through the sapphire substrate.

BACKGROUND ART

There have been heretofore many nitride semiconductor light emitting elements, such as LEDs (light emitting diodes) and semiconductor lasers, in which sapphire is used as a substrate and a light emitting element structure including a plurality of nitride semiconductor layers is formed on the substrate of sapphire by epitaxial growth. The nitride semiconductor layer is represented by the general formula: $Al_{1-x-y}Ga_xIn_yN$ ($0 \leq x \leq 1$, $0 \leq y \leq 1$, $0 \leq x+y \leq 1$).

The light emitting structure has a double-hetero structure in which an active layer including a nitride semiconductor layer of single-quantum-well structure (SQW) or multi-quantum-well structure (MQW) is sandwiched between an n-type nitride semiconductor layer and a p-type nitride semiconductor layer. When the active layer is an AlGaN-based semiconductor layer, by adjusting an AlN molar fraction (also referred to as an Al composition ratio), band gap energy can be adjusted within a range where band gap energies that can be taken by GaN and AlN (about 3.4 eV and about 6.2 eV) are lower and upper limits, so that an ultraviolet light emitting element having a light emission wavelength of about 200 nm to about 365 nm is obtained.

A nitride semiconductor light emitting element is formed as follows. A plurality of nitride semiconductor layers are epitaxially grown on a wafer substrate composed of sapphire or the like, and an electrode structure is formed. Thereafter, the wafer substrate is divided into chips each having a planarly-viewed shape of a square or a rectangle. In the case where a sapphire wafer substrate is employed, generally the thickness of the wafer is about 300 μm or greater. A thin wafer is so difficult to be handled in a process of forming the element structure on the wafer substrate, that the wafer is highly possibly damaged. On the other hand, the wafer is preferably thin for being diced along the boundary on the wafer between the chips with a diamond blade, a laser or the like so that the wafer is divided into individual chips. In general, the wafer has its back surface polished (which may include abrading, grinding and the like as pretreatment) to attain a reduced thickness of 100 μm±30 μm, more preferably 80 μm to 100 μm, and thereafter is divided into individual chips (for example, see Patent Documents 1 and 2 below).

In Patent Document 1, a sapphire substrate of a blue-color LED of 350 μm square being a nitride semiconductor light emitting element has its thickness reduced to 150 μm, preferably to 100 μm. Further, in Patent Document 2, a sapphire substrate of a blue-color LED of 300 μm to 500 μm square being a nitride semiconductor light emitting element has its thickness reduced to 50 μm to 120 μm, preferably to 80 μm to 100 μm.

Meanwhile, since light emitted from the active layer travels in every direction, that is, toward both the upper and lower surfaces of the chip, there exists a back-surface-emitting type nitride semiconductor light emitting element in which the light traveling toward the upper surface is reflected by the upper surface of the chip downward, so that the reflected light together with the light traveling toward the lower surface is transmitted through the sapphire substrate and output from the lower surface of the chip to the outside of the chip (for example, see Patent Documents 3 and 4 below).

PRIOR ART DOCUMENTS

Patent Documents

Patent Document 1: Japanese Patent Application Publication No. 2010-199603
Patent Document 2: Japanese Patent Application Publication No. 2005-109432
Patent Document 3: Japanese Patent Application Publication No. 2008-66727
Patent Document 4: Japanese Patent Application Publication No. 2005-210051

SUMMARY OF THE INVENTION

Problems to be Solved by the Invention

With the above-described back-surface-emitting type nitride semiconductor light emitting element, while the thickness of a general sapphire substrate is 100 μm±30 μm, the thickness of the light emitting element structure portion formed on the sapphire substrate is about a few μm to 10 μm, and the thickness of the active layer is, for example, about a few nm. Accordingly, the light emission source of the nitride semiconductor light emitting element exists in a planar manner on the front surface side of the sapphire substrate.

Light emitted from any one point (point light source) in the planar light emission source (surface light source) of the back-surface-emitting type nitride semiconductor light emitting element toward the sapphire substrate passes through nitride semiconductor layers between the active layer and the sapphire substrate and enters inside the sapphire substrate, and output to the outside of the chip from the back surface or the side surface of the sapphire substrate.

FIG. 1 schematically shows a nitride semiconductor light emitting element divided into an individual chip, in which light emitted from any point (point light source) P of a surface light source S on the front surface side of a sapphire substrate passes through the sapphire substrate 1 and is output to the outside of the chip.

Sapphire is optically anisotropic and birefringent. When the active layer is an AlGaN-based semiconductor layer, as described above, the emitted light is ultraviolet light having a wavelength of about 200 nm to 365 nm. Here, when the light emission wavelength is about 300 nm to 350 nm, the average refractive index of sapphire is about 1.8. In the case where the outside of the sapphire substrate is the air, the refractive index of the outside is 1. Therefore, provided that the refractive index of sapphire is 1.8, a critical angle θc at the interface between the sapphire substrate and the outside air is about 34°.

When an input angle θin formed by light from the inside of the sapphire substrate toward the outside of the chip relative to the interface between the sapphire substrate and the outside air is equal to or greater than the critical angle θc, the light totally reflects into the sapphire substrate without being output to the outside of the chip. Note that, in the following description of the light extraction from the sapphire substrate 1 to the outside of the chip given with reference to FIGS. 1, 2, 9 and others, for the sake of convenience, the direction from the surface light source S to a back surface 1r of the sapphire substrate 1 is referred to as the upward direction so as to correspond to the orientation of the drawings. Conversely, in a description of the element structure of the nitride semiconductor light emitting element, the direction from the back surface 1r of the sapphire substrate 1 to the light emitting element structure portion including the active layer (the surface light source S) is referred to as the upward direction.

Note that, in the case where a transparent resin film whose refractive index is an intermediate value between the refractive index of sapphire and that of the air is provided on the upper side of the back surface 1r of the sapphire substrate 1, when the upper surface of the resin film is parallel to the back surface 1r of the sapphire substrate 1, a critical angle θc1 at the interface between the sapphire substrate 1 and the resin film becomes greater than the critical angle θc. Then, even light input by an angle equal to or greater than the critical angle θc at the interface between the sapphire substrate and the air transmits to the resin film side without being totally reflected, if the input angle is smaller than the critical angle θc1. However, since the output angle of the transmitted light becomes greater than the input angle, an input angle to the upper surface of the resin film becomes greater than a critical angle θc2 at the interface between the resin film and the outside air and total reflection is invited. Therefore, when the resin film is parallel flat plate-like, light from inside the sapphire substrate 1 input to the back surface 1r by an angle equal to or greater than the critical angle θc is totally reflected at any of the interfaces irrespective of the provision of the resin film, and totally reflected diagonally downward without being output to the outside of the chip.

Light from the point light source P input to the front surface 1t of the sapphire substrate 1 and subsequently output into the sapphire substrate 1 by an output angle θin is input to the back surface 1r by an input angle θin. As described above, since the distance from the active layer to the front surface θt of the sapphire substrate 1 is sufficiently small as compared to a thickness T of the sapphire substrate, it can be regarded that the point light source P exists on the front surface 1t of the sapphire substrate 1. Accordingly, being input to the back surface 1r of the sapphire substrate 1, every light whose output angle θin from the point light source P on the front surface 1t is smaller than the critical angle θc (hereinafter, for the sake of convenience, such light is referred to as "upward output light") transmits to the outside of the chip by predetermined transmittance without inviting total reflection. Note that, when the point light source P is positioned at around the periphery of the chip, part of the upward output light is input to side surfaces 1s of the sapphire substrate 1 instead of the back surface 1r. Here, the side surfaces 1s obtained by dicing are coarse surfaces and not polished surfaces like the back surface 1r. Therefore, the light input to the side surfaces 1s partially transmits to the outside of the chip instead of being totally reflected. Accordingly, the upward output light emitted from the point light source P transmits to the outside of the chip by predetermined transmittance. The transmittance of the upward output light is substantially constant irrespective of the thickness T of the sapphire substrate 1.

Next, light whose output angle θin from the point light source P on the front surface 1t of the sapphire substrate 1 is equal to or greater than the critical angle θc (hereinafter, for the sake of convenience, such light is referred to as "sideways output light") is discussed. FIG. 2 schematically shows upward output light Lu and sideways output light Ls.

The sideways output light Ls is classified into: first sideways output light Ls1 that directly arrives at the side surfaces 1s from the point light source P; second sideways output light Ls2 that is input from the point light source P to the back surface 1r and totally reflected thereby, and indirectly arrives at the side surfaces 1s; and third sideways output light Ls3 that is input from the point light source P to the back surface 1r and totally reflected thereby, and arrives at the front surface 1t without arriving at the side surfaces 1s. Here, the first sideways output light Ls1 and the second sideways output light Ls2 are output to the outside of the chip by predetermined transmittance without being totally reflected irrespective of the input angle to the apparent side surfaces 1s because the side surfaces 1s are coarse surfaces. On the other hand, the third sideways output light Ls3 again enters the light emitting element structure and is not output to the outside of the chip. That is, the light that is input from the point light source P into the sapphire substrate 1 and that can be effectively extracted to the outside of the chip is the upward output light Lu and the first and second sideways output light Ls1 and Ls2.

As the proportion of the first and second sideways output light Ls1 and Ls2 in the sideways output light Ls that arrive at the side surfaces 1s is greater, the light extraction efficiency is higher. Since the transmittance of the upward output light Lu is substantially constant irrespective of the thickness T of the sapphire substrate 1, it directly contributes to the light extraction efficiency. However, the proportion of the first and second sideways output light Ls1 and Ls2 relative to the whole sideways output light Ls varies depending on the position of the point light source P and the thickness T of the sapphire substrate 1. Since the proportion of the first and second sideways output light Ls1 and Ls2 is greater as the thickness T is greater, it is understood that the light extraction efficiency improves. Conversely, when the chip is reduced in thickness by having the back surface of the sapphire substrate 1 polished, the light extraction efficiency reduces.

However, conventionally, it has not been specifically considered as to the thickness T of the sapphire substrate 1 and the light extraction efficiency, and as described above, the thickness T of a substrate has been reduced to about 100 μm±30 μm irrespective of the chip size, with emphasis being placed on the workability of the wafer being divided into individual chips. Note that, the chip size refers to the longitudinal and lateral dimensions of a chip in the planarly-viewed shape.

The present invention has been made to solve the problem described above, and an object thereof is to improve the light extraction efficiency by clarifying the relationship among the thickness and chip size of a sapphire substrate and the light extraction efficiency and optimizing the thickness of the sapphire substrate relative to the chip size.

Means for Solving the Problem

As a result of thorough study conducted by the inventor of the present invention, it is found that, with a back-surface-emitting type nitride semiconductor light emitting element, out of light extracted to the outside of a chip through a sapphire substrate, the amount of the upward output light Lu is substantially constant irrespective of the thickness of the sapphire substrate, whereas the amount of the sideways output light Ls becomes greater as the thickness of the sapphire substrate is greater, improving the light extraction efficiency. It is further found that certain relationship is established between the optimum thickness of the sapphire substrate and the chip size.

The invention of the present application has been made based on the above-mentioned new findings, and provides as a first feature a nitride semiconductor light emitting element comprising: a sapphire substrate; and a light emitting element structure portion that has a plurality of nitride semiconductor layers formed on the sapphire substrate, wherein the nitride semiconductor light emitting element is a back-surface-emitting type nitride semiconductor light emitting element that outputs light from the light emitting element structure portion to an outside of the element through the sapphire substrate, the nitride semiconductor light emitting element being divided into a chip whose planarly-viewed shape is a square or a rectangle, an average length of sides of the planarly-viewed shape of the chip is 400 μm or greater, and a thickness of the sapphire substrate is 0.45 to 1 times the average length.

More preferably, according to the nitride semiconductor light emitting element with the first feature, as a second feature, the light emitting element structure portion includes: a base structure portion that includes an AlGaN-based semiconductor layer formed on the sapphire substrate; and a light emitting laminated portion formed on a crystal surface of the base structure portion, the light emitting laminated portion including an n-type clad layer being an n-type AlGaN-based semiconductor layer, an active layer having an AlGaN-based semiconductor layer, and a p-type clad layer being a p-type AlGaN-based semiconductor layer.

More preferably, according to the nitride semiconductor light emitting element with the first or second feature, as a third feature, the thickness of the sapphire substrate is 0.5 times or greater the average length.

More preferably, according to the nitride semiconductor light emitting element with the first to third features, as a fourth feature, the thickness of the sapphire substrate is 0.8 times or less the average length.

More preferably, according to the nitride semiconductor light emitting element with the first to fourth features, as a fifth feature, the chip is obtained from a wafer being divided by stealth dicing.

More preferably, according to the nitride semiconductor light emitting element with the first to fifth features, as a sixth feature, the average length is 500 μm or greater.

Furthermore, the invention of the present application provides as a first feature a method for manufacturing a nitride semiconductor light emitting element, the method comprising: forming a light emitting element structure portion having a plurality of nitride semiconductor layers on a sapphire substrate as a wafer having a first thickness; polishing a back surface of the sapphire substrate as the wafer on which the light emitting element structure portion is formed, so as to reduce a thickness of the sapphire substrate to a second thickness being smaller than the first thickness; and dividing the wafer in which the light emitting element structure portion is formed on the sapphire substrate having its thickness reduced into a chip of a nitride semiconductor light emitting element whose planarly-viewed shape is a square or a rectangle, wherein the nitride semiconductor light emitting element is a back-surface-emitting type light emitting element that outputs light emitted from the light emitting element structure portion to an outside of the element through the sapphire substrate, an average length of sides of the planarly-viewed shape of the nitride semiconductor light emitting element is 400 μm or greater, and the second thickness is 0.45 to 1 times the average length. Note that, the polishing in reducing the thickness may include abrading, grinding and the like as pretreatment.

More preferably, according to the method of manufacturing the nitride semiconductor light emitting element with the first feature, as a second feature, the forming the light emitting element structure portion includes: forming a base structure portion including an AlGaN-based semiconductor layer on the sapphire substrate as the wafer having the first thickness; and forming, on a crystal surface of the base structure portion, a light emitting laminated portion that includes an n-type clad layer being an n-type AlGaN-based semiconductor layer, an active layer having an AlGaN-based semiconductor layer, and a p-type clad layer being a p-type AlGaN-based semiconductor layer.

More preferably, according to the method of manufacturing the nitride semiconductor light emitting element with the first or second feature, as a third feature, in the dividing the wafer into the chip, stealth dicing is performed.

More preferably, according to the method of manufacturing the nitride semiconductor light emitting element with the third feature, as a fourth feature, in the performing the stealth dicing, a plurality of focal points of a laser beam used in the stealth dicing are set in a thickness direction of the sapphire substrate.

Effect of the Invention

With the nitride semiconductor light emitting element and the method for manufacturing the same according to the above-described features, in connection with a back-surface-emitting type nitride semiconductor light emitting element, about 95% or greater light that can be extracted at the maximum out of light emitted from inside of a chip can be highly efficiently extracted to the outside of the chip, irrespective of the chip size.

In a nitride semiconductor light emitting element structured including an AlGaN-based semiconductor layer, generally, on a base structure portion, an n-type clad layer, an active layer, and a p-type clad layer are sequentially laminated. As the topmost layer, a p-type contact layer that forms an ohmic contact with a p electrode is formed. Further, in order to implement an excellent ohmic contact with the p electrode, a p-type GaN layer is employed as the p-type contact layer. However, the GaN layer absorbs light emitted from the active layer being an AlGaN-based semiconductor layer having a higher Al molar fraction. Therefore, with the AlGaN-based semiconductor light emitting element, the structure of the p electrode and that of the p-type contact layer need to be elaborately contrived for light to be extracted from the upper surface of the chip. Effective means for avoiding such a trouble with the p-type contact layer include a back-surface-emitting type nitride semiconductor light emitting element being the subject of the present invention. Accordingly, the nitride semiconductor light emitting element or the method for manufacturing the same according to the above-described features is more suitable for a nitride semiconductor light emitting element including an AlGaN-based semiconductor layer.

In the present invention, the AlGaN-based semiconductor is based on a ternary (or binary) compound expressed by a general formula $Al_xGa_{1-x}N$ (x represents AlN molar fraction, $0 \leq x \leq 1$), and is a group-III nitride semiconductor whose bandgap energy falls within a range of bandgap energy of GaN (x=0) and AlN (x=1) (about 3.4 eV and about 6.2 eV) as the lower and upper limits, respectively. The AlGaN-based semiconductor may contain a slight amount of In so long as the condition as to the bandgap energy is satisfied.

DESCRIPTION OF EMBODIMENT

Figure 1:
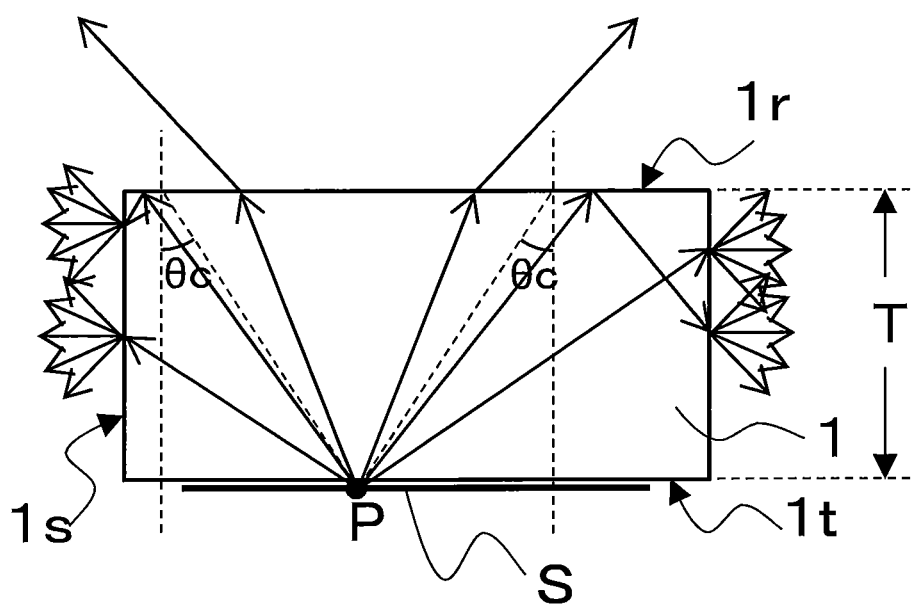
FIG. 1 is a diagram schematically describing extraction of light from a sapphire substrate to the outside of a chip.
Figure 2:
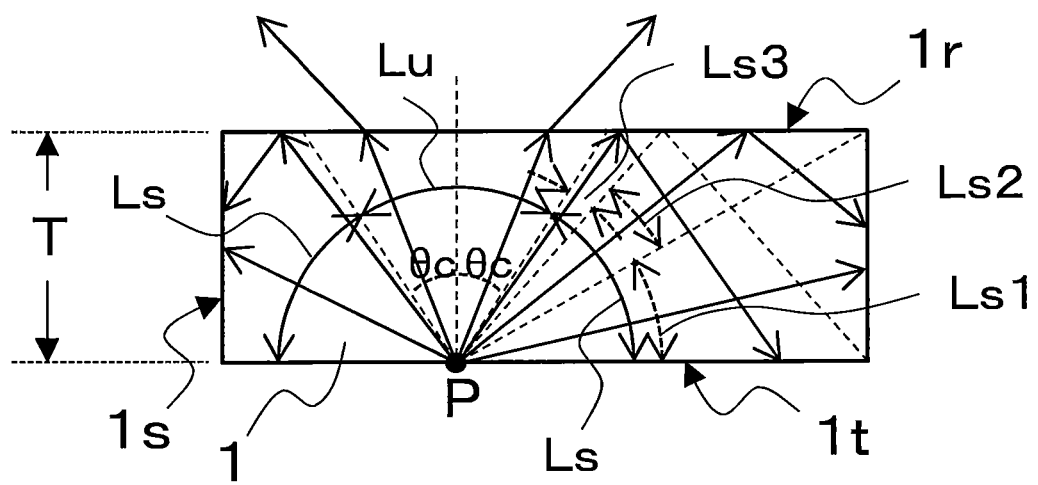
FIG. 2 is a diagram schematically showing upward output light and sideways output light that are emitted from a point light source on the front surface of the sapphire substrate into the sapphire substrate.

A nitride semiconductor light emitting element in each of embodiments in the present invention (hereinafter, referred to as the "present light emitting element" occasionally) will be described with reference to the drawings. In addition, for easy understanding of the description, an essential part is emphasized to schematically illustrate invention contents in the drawings used in the following description, so that a dimensional ratio of each component does not correspond to a dimensional ratio of an actual element actually to be used. Hereinafter, the description will be given supposing a case where the present light emitting element is a light emitting diode.

Figure 3:
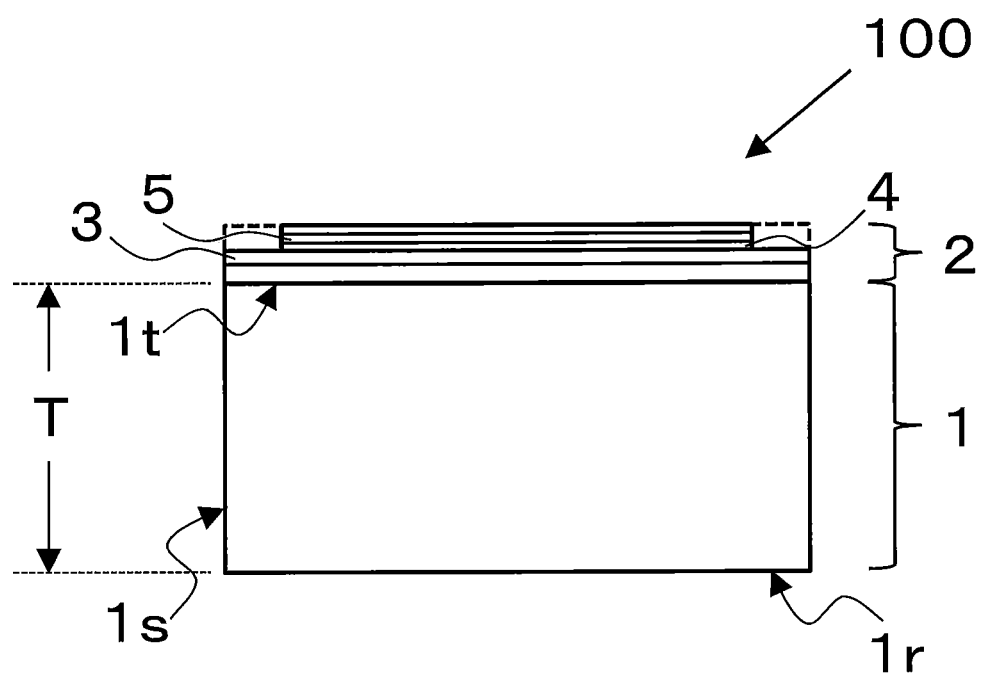
FIG. 3 is a cross-sectional view schematically showing the basic structure of a nitride semiconductor light emitting element of the present invention.

As shown in FIG. 3, a light emitting element 100 includes a sapphire substrate 1, and a light emitting element structure portion 2 having a plurality of nitride semiconductor layers formed on the sapphire substrate 1. Further, the light emitting element structure portion 2 has a double hetero structure in which, at least an active layer 4 being a nitride semiconductor layer of a single-quantum-well structure or a multi-quantum-well structure is interposed between an n-type clad layer 3 being an n-type nitride semiconductor layer and a p-type clad layer 5 being a p-type nitride semiconductor layer.

Figure 4:
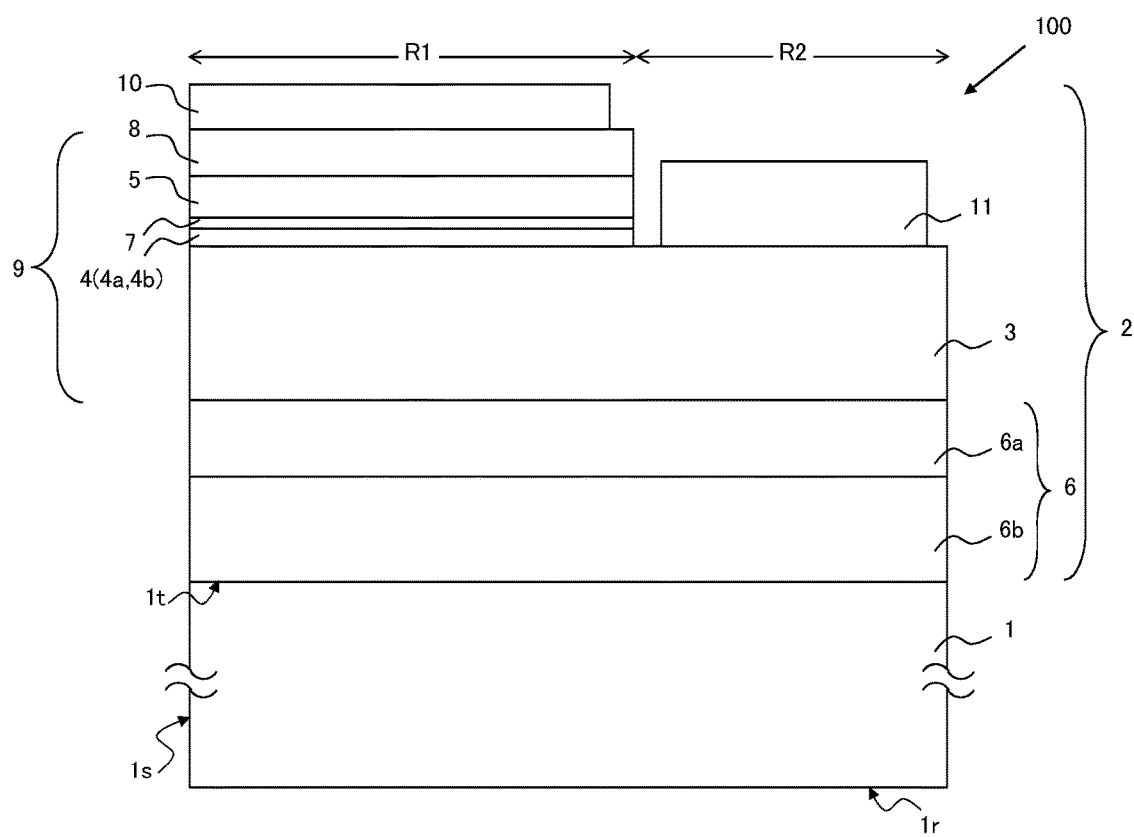
FIG. 4 is a cross-sectional view of the substantial part schematically showing an example of a more detailed element structure of the nitride semiconductor light emitting element of the present invention.

In the case where the nitride semiconductor layers structuring the light emitting element structure portion 2 are AlGaN-based semiconductor layers, as shown in a cross-sectional view of a substantial portion of FIG. 4, the light emitting element structure portion 2 includes, as an example, a base structure portion 6 which is formed on the sapphire surface 1 and is made up of an AlN layer 6a and an AlGaN layer 6b. The light emitting element structure portion 2 further includes a light emitting laminated portion 9 including the n-type clad layer 3 composed of n-type AlGaN, the active layer 4, an electron block layer 7 composed of p-type AlGaN and having a higher Al molar fraction than the active layer 4, the p-type clad layer 5 composed of p-type AlGaN, and a p-type contact layer 8 composed of p-type GaN which are sequentially laminated on the base structure portion 6.

The base structure portion 6 does not necessarily have the two-layer structure of the AlN layer 6a and the AlGaN layer 6b, and may have a single-layer structure of one of the AlN layer 6a and the AlGaN layer 6b. Alternatively, the base structure portion 6 may have three or more layers.

The light emitting laminated structure 9 is configured such that parts of the active layer 4, the electron block layer 7, the p-type clad layer 5, and the p-type contact layer 8 formed on the n-type clad layer 3 are removed by reactive ion etching until a part of a surface of the n-type clad layer 3 is exposed, and the laminated structure from the active layer 4 to the p-type contact layer 8 is formed in a first region R1 on the n-type clad layer 3. Further, a p electrode 10 composed of, for example, Ni/Au, is formed on the surface of the p-type contact layer 8, and an n electrode 11 composed of, for example, Ti/Al/Ti/Au, is formed on part of the exposed region (a second region R2) of the n-type clad layer 3.

The active layer 4 has a single-layer quantum well structure composed of an n-type AlGaN barrier layer 4a and an AlGaN well layer 4b, for example. The active layer 4 has a double hetero junction structure in which it is sandwiched between the lower and upper n-type and p-type AlGaN layers each having a higher AlN molar fraction, or may have a multiple quantum well structure composed of a plurality of the above single-layer quantum well structures.

Each AlGaN layer is formed on the sapphire substrate 1 in the form of a wafer which has yet to be made into a thin plate by polishing, for example, by a known epitaxial growth method such as metal-organic vapor phase epitaxy (MOVPE) method or molecular beam epitaxy (MBE)

method. Si is used as a donor impurity for the n-type layer, and Mg is used as an acceptor impurity for the p-type layer, for example. Furthermore, when a conductivity type is not shown in the AlN layer and the AlGaN layer, the layers are undoped layers which are not doped with an impurity.

Note that, the nitride semiconductor layers structuring the light emitting element structure portion 2 are not limited to AlGaN-based semiconductor layers. Further, in the case where the nitride semiconductor layers are AlGaN-based semiconductor layers also, the thickness and Al molar fraction of each layer can be changed as appropriate depending on the specification of the light emitting element 100.

A wafer having a plurality of light emitting elements 100 each provided with the light emitting element structure portion 2 has the back surface of the sapphire substrate 1 grinded and polished so that the thickness is reduced to a predetermined thickness (corresponding to a second thickness). Thereafter, the wafer is diced into chips being square or rectangular in a plan view. Thus, a bare chip of the light emitting element 100 is obtained. The predetermined thickness is preferably 0.45 to 1 times an average length Lav of the sides of the planarly-viewed chip. Note that, the thickness of the sapphire substrate 1 before thinned (corresponding to a first thickness) is greater than the predetermined thickness.

Note that, the dicing method is not particularly limited, and any known dicing method may be used. However, as will be described later, since the thickness of the sapphire substrate 1 of the light emitting element 100 after the thinning is greater depending on the chip size than a conventional normal thickness, it is preferable to employ the known stealth dicing than the conventionally generally used method in which a diamond blade is used. The stealth dicing has been developed and come into practical use for dicing an ultra-thin semiconductor wafer at high speeds and with high quality. With the stealth dicing, a laser beam at a wavelength that can transmit through a wafer is condensed to be focused within the wafer. The wafer is cut by local absorption of laser energy by the nonlinear absorption effect at the focal point. In the present embodiment, the stealth dicing is applied to dicing of a thick wafer. Specifically, the stealth dicing is applied to a thick wafer as follows. A plurality of focal points are set in the thickness direction of the sapphire substrate, and the sapphire substrate is scanned with a laser beam along the boundary between the chips at the focal points. As an example, the focal points are set at an interval of about 100 μm in the thickness direction.

Figure 5:
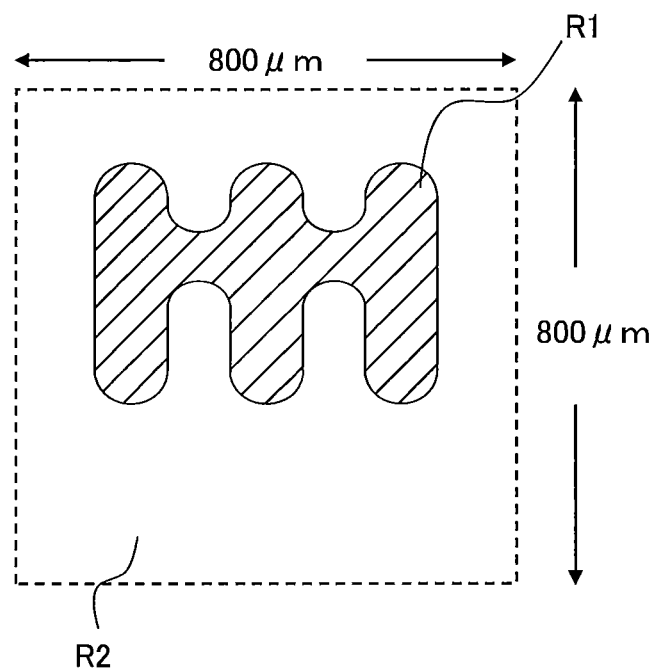
FIG. 5 is a plan view schematically showing an example of a planarly-viewed pattern of the nitride semiconductor light emitting element of the present invention.

FIG. 5 shows an example of a planarly-viewed pattern of the light emitting element 100 diced into a chip having a square planarly-viewed shape. FIG. 5 shows a first region R1 and a second region R2 before formation of the electrodes 10 and 11. The p electrode 10 is formed substantially over the entire first region R1. The second region corresponds to the region on the n-type clad layer 3 excluding the first region. The chip size of the light emitting element 100 shown in FIG. 5 is, as an example, 800 μm both longitudinally and laterally. Note that, the planarly-viewed shape of the light emitting element 100 is not limited to a square, and may be a rectangle. The chip size and the shape and area of the first region R1 are also not limited to the exemplary value or shape shown in FIG. 5.

Figure 6:
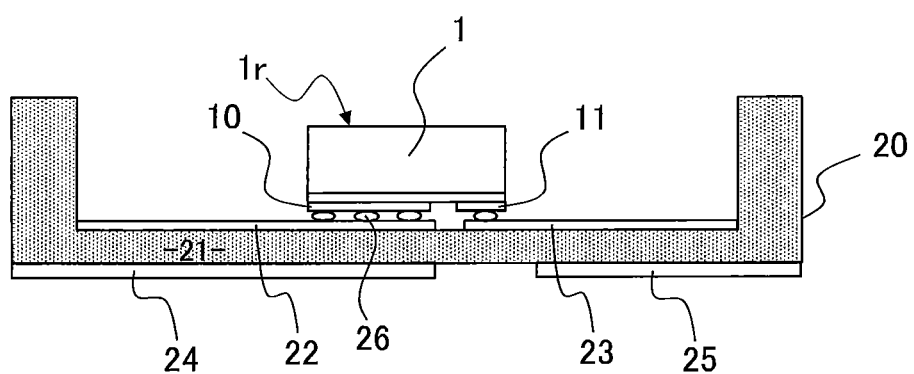
FIG. 6 is a cross-sectional view schematically showing an example of the nitride semiconductor light emitting element of the present invention mounted on a submount by flip-chip mounting.

The light emitting element 100 is a back-surface-emitting type light emitting element in which light emitted from the active layer 4 is extracted to the outside of the chip through the sapphire substrate 1. As an example, as shown in FIG. 6, the light emitting element 100 is placed on a submount 20 with the back surface 1r of the sapphire substrate 1 facing upward and the p electrode 10 and the n electrode 11 facing downward. That is, the light emitting element 100 is mounted by so-called flip-chip mounting. In the submount 20, a first metal electrode wiring 22 on the anode side and a second metal electrode wiring 23 on the cathode side are formed on part of the surface of a base material 21 composed of an insulating material. The first and second metal electrode wirings 22 and 23 are respectively connected to lead terminals 24 and 25 provided on the back surface side of the base material 21 via penetration electrodes (not shown) provided in the base material 21. By the flip-chip mounting, the p electrode 10 and the n electrode 11 of the light emitting element 100 are respectively connected onto the first and second metal electrode wirings 22 and 23 via bumps 26. Thus, the light emitting element 100 in a chip shape is fixed onto the submount 20, and the p electrode 10 and the n electrode 11 are respectively electrically connected to the lead terminals 24 and 25 formed at the submount 20. Note that, the light emitting element 100 placed on the submount 20 is preferably structured such that the back surface 1r of the sapphire substrate 1 and the side surfaces of the chip are sealed by resin that is transparent to light emitted from the active layer 4. Further, the sealing resin is preferably a resin whose refractive index is greater than 1 and smaller than the refractive index of sapphire.

The light emitting element 100 is characterized in that the thickness T of the sapphire substrate 1 is 0.45 to 1 times the average length Lav of the sides of the planarly-viewed shape of the chip. Here, in the case where the planarly-viewed shape of the chip is a square, the average length Lav of the sides is equal to a length L of one side of the square. In the case where the planarly-viewed shape of the chip is a rectangle, the average length Lav of the chip is equal to an average value (L1+L2)/2 of a length L1 of the long side of the rectangle and a length L2 of the short side of the rectangle.

Next, a description will be given of the reason of the thickness T of the sapphire substrate 1 being 0.45 to 1 times the average length Lav of the sides of the planarly-viewed chip in the light emitting element 100 with reference to the drawings.

In the following description, the chip size and the thickness T of the sapphire substrate 1 are nondimensionalized. As to two types of chips respectively having a square planarly-viewed shape and a rectangular planarly-viewed shape (Example 1, Example 2), for light beams output from a plurality of point light sources P on the front surface 1t of the sapphire substrate 1, a light output Qu of the upward output light Lu and a light output sum Qs of the first and second sideways output light Ls1 and Ls2 are approximately calculated from the following mathematical expressions. Based on the calculation result, a light output Q extracted to the outside of each chip from the surface light source S is approximately calculated. Note that, the transmittance of light not totally reflected by the back surface 1r and the side surfaces 1s of the sapphire substrate 1 is assumed to be 100%, and the influence of the transmittance is ignored.

Figure 7:
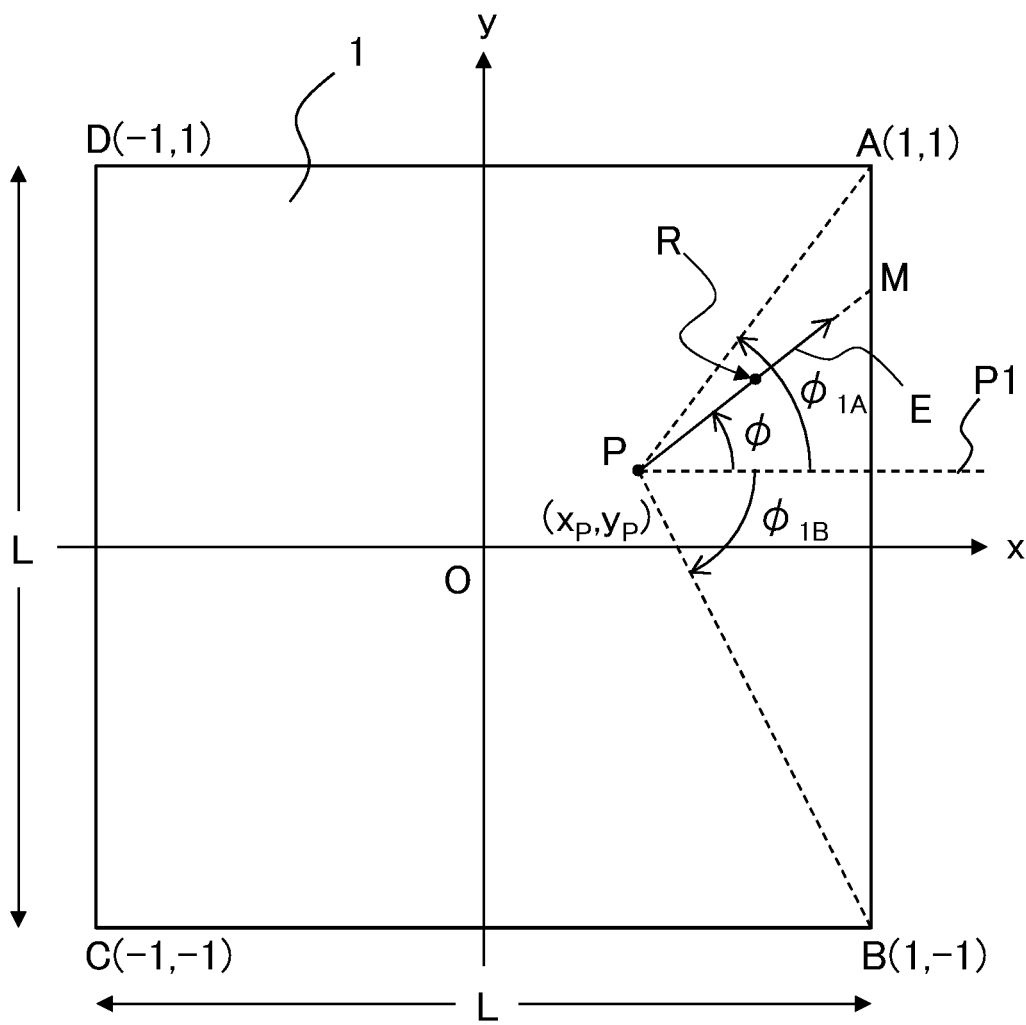
FIG. 7 is a plan view showing a sapphire substrate of Example 1 whose planarly-viewed shape is a square.
Figure 8:
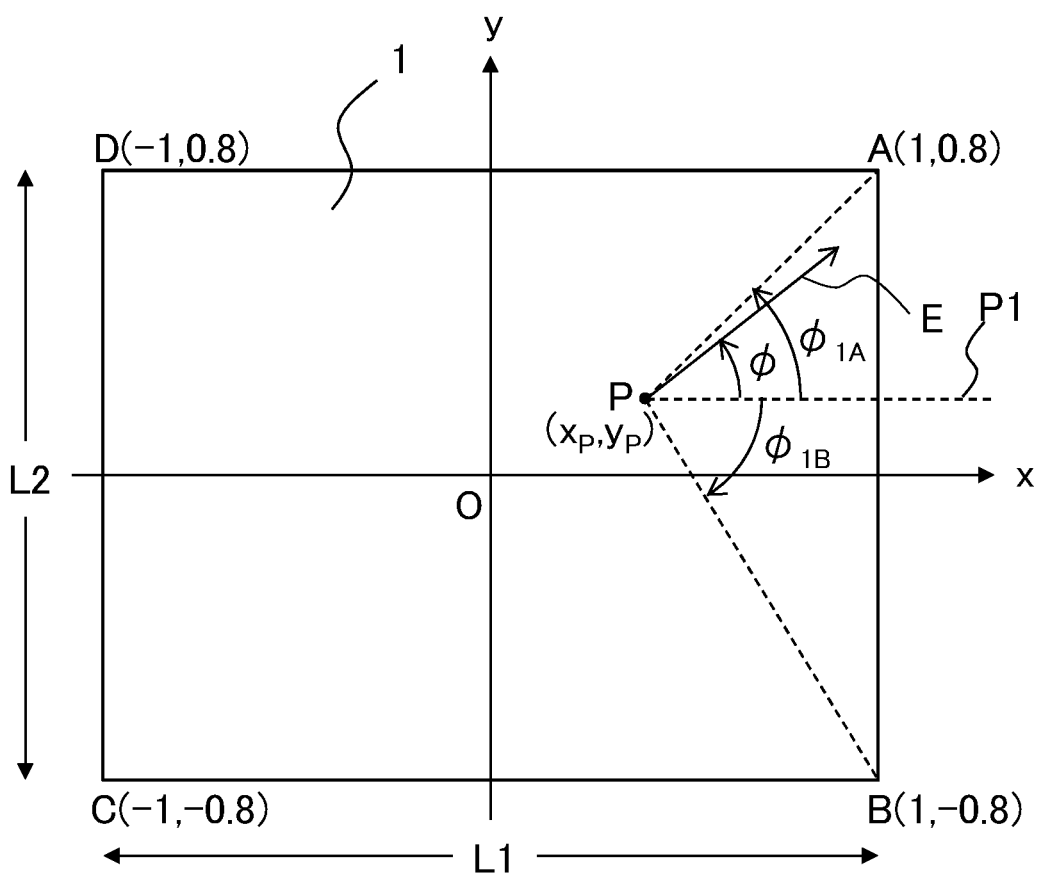
FIG. 8 is a plan view showing a sapphire substrate of Example 2 whose planarly-viewed shape is a square.
Figure 9:
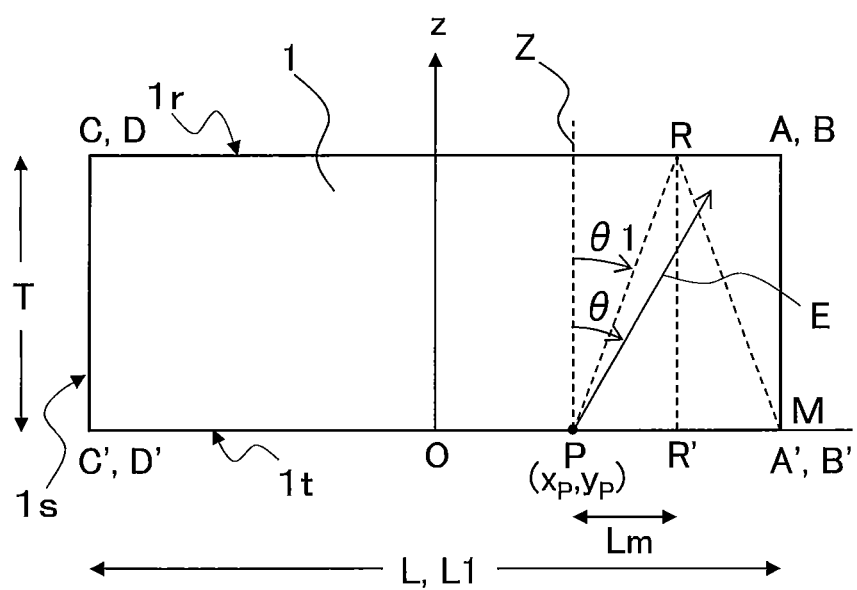
FIG. 9 is a side view showing the sapphire substrate of Examples 1 and 2.

FIG. 7 is a plan view of the sapphire substrate 1 of Example 1 whose planarly-viewed shape is a square. FIG. 8 is a plan view of the sapphire substrate 1 of Example 2 whose planarly-viewed shape is a rectangle. FIG. 9 is the side view of the sapphire substrate 1 of Examples 1 and 2. The apexes of the sapphire substrate 1 having a square or rectangular planarly-viewed shape are represented by A, B, C, and D. In a side view, since the apexes on the back surface 1r and the apexes on the front surface 1t are separated from each other on the top and bottom ends of the thickness T, the apexes on the back surface 1r are represented by A, B, C, and D, and the corresponding apexes on the front surface 1t are represented by A', B', C', and D'. Note that, in the plan views of FIGS. 7 and 8, the apexes A', B', C', and D' are respectively regarded as being identical to the apexes A, B, C, and D.

For the sake of convenience, the front surface 1t and the back surface 1r of the sapphire substrate 1 are each regarded as a plane that is parallel to the xy plane including the x axis and the y axis of an orthogonal coordinate system, in which the xy coordinates of the apexes A, B, C, and D of the square of Example 1 are (1, 1), (1, −1), (−1, −1), and (−1, 1), respectively, and the xy coordinates of the apexes A, B, C, and D of the rectangle of Example 2 are (1, 0.8), (1, −0.8), (−1, −0.8), and (−1, 0.8), respectively. The origin point (0, 0) of the xy coordinates represents the center O of each of the square and the rectangle. With the square of Example 1, the length L of one side is 2. With the rectangle of Example 2, the length L1 of the long side is 2, and the length L2 of the short side is 1.6. Note that, FIGS. 7 and 8 show the case, as an example, in which the line passing through the midpoint of a side CD and the midpoint of a side AB is the x axis, the line passing through the midpoint of a side BC and the midpoint of a side DA is the y axis, the direction from the side CD to the side AB is the +x direction, and the direction from the side BC to the side DA is the +y direction.

The following 15 points are used as the xy coordinates of the point light sources P in Example 1.
P00: (0, 0)
P20: (0.2, 0)
P22: (0.2, 0.2)
P40: (0.4, 0)
P42: (0.4, 0.2)
P44: (0.4, 0.4)
P60: (0.6, 0)
P62: (0.6, 0.2)
P64: (0.6, 0.4)
P66: (0.6, 0.6)
P80: (0.8, 0)
P82: (0.8, 0.2)
P84: (0.8, 0.4)
P86: (0.8, 0.6)
P88: (0.8, 0.8)

The following 15 points are used as the xy coordinates of the point light sources P in Example 2.
P00: (0, 0)
P03: (0, 0.3)
P06: (0, 0.6)
P20: (0.2, 0)
P23: (0.2, 0.3)
P26: (0.2, 0.6)
P40: (0.4, 0)
P43: (0.4, 0.3)
P46: (0.4, 0.6)
P60: (0.6, 0)
P63: (0.6, 0.3)
P66: (0.6, 0.6)
P80: (0.8, 0)
P83: (0.8, 0.3)
P86: (0.8, 0.6)

A polar coordinate system in which one point light source P is the origin point is assumed. An angle $\theta$ is formed between a normal line Z that passes through the point light source P and is perpendicular to the front surface 1t of the sapphire substrate 1 and a light beam E output from the point light source P. An angle $\varphi$ is formed between the planarly-viewed light beam E and the x axis. A direction where $\varphi=0$ is established is the +x direction.

An intensity $\Delta Q$ of the light beam E output from the point light source P in $\theta$ direction per unit small area is obtained from the following Mathematical Expression 1, where I is a constant representing the light intensity per unit small area of the light beam emitted in the direction where $\theta=0$ is established.

$$\Delta Q = I \cos(\theta) \qquad \text{[Mathematical Expression 1]}$$

As described above, since the light output Qu of the upward output light Lu output from the point light source P is entirely output to the outside of the chip, the light output Qu is obtained by the following Mathematical Expression 2 irrespective of the position of the point light source P.

$$\begin{aligned} Qu &= \int_0^{2\pi} \int_0^{\theta c} \Delta Q \sin(\theta) d\theta d\phi \qquad \text{[Mathematical Expression 2]} \\ &= \int_0^{2\pi} \int_0^{\theta c} I \cos(\theta) \sin(\theta) d\theta d\phi \\ &= I\pi \int_0^{\theta c} \sin(2\theta) d\theta \\ &= I\pi (1 - \cos(2\theta c))/2 \end{aligned}$$

A light output Qall of the entire output light that is output from the point light source P into the sapphire substrate 1 is calculated by Mathematical Expression 2 integrating $\theta$ in a range of 0 to $\pi/2$, and Qall=I$\pi$ is obtained. On the other hand, when the critical angle $\theta c$ is 33.75° (the refractive index of sapphire is 1.8), Qu=I$\pi \times$0.309 is obtained. Accordingly, the proportion of the light output Qu of the upward output light Lu relative to the light output Qall of the entire output light is about 30%.

The light output sum Qs of the first and second sideways output light Ls1 and Ls2 output from the point light source P is, as represented in the following Mathematical Expression 3, broken down into a light output Qs1 that passes through a side surface 1s1 surrounded by the apexes A, B, B', and A', a light output Qs2 that passes through a side surface 1s2 surrounded by the apexes B, C, C', and B', a light output Qs3 that passes through a side surface 1s3 surrounded by the apexes C, D, D', and C', and a light output Qs4 that passes through a side surface 1s4 surrounded by the apexes D, A, A', and D'.

$$Qs = Qs1 + Qs2 + Qs3 + Qs4 \qquad \text{[Mathematical Expression 3]}$$

As an example, the light output Qs1 is obtained by the following Mathematical Expression 4.

$$\begin{aligned} Qs1 &= \int_{\phi 1B}^{\phi 1A} \int_{\theta x}^{\pi/2} \Delta I \sin(\theta) d\theta d\phi \qquad \text{[Mathematical Expression 4]} \\ &= \int_{\phi 1B}^{\phi 1A} \int_{\theta x}^{\pi/2} I \cos(\theta) \sin(\theta) d\theta d\phi \\ &= \frac{I}{2} \int_{\phi 1B}^{\phi 1A} \int_{\theta x}^{\pi/2} \sin(2\theta) d\theta d\phi \\ &= \frac{I}{4} \int_{\phi 1B}^{\phi 1A} (1 + \cos(2\theta x)) d\phi \end{aligned}$$

In Mathematical Expression 4, as shown in FIG. 7, the direction of a perpendicular P1 extending from the point light source P to a line segment AB is the direction where $\varphi=0$ is established; an angle formed between the perpendicular P1 and a line segment PA is φ1A; and an angle formed between the perpendicular P1 and a line segment PB is φ1B. Note that, since the normal direction of the angle φ is the counterclockwise direction in FIG. 7, in Mathematical Expression 4, φ1A is a positive value and φ1B is a negative value. φ1A and φ1B are obtained by the following Mathematical Expressions 5 and 6, respectively. Note that, in Mathematical Expressions 5 and 6, xp and yp are the x coordinate and the y coordinate of the point light source P; xA and yB are the x coordinate and the y coordinate of the apex A; and xB and yB are the x coordinate and the y coordinate of the apex B.

$$\phi 1A = \tan^{-1}\left(\frac{yA - yp}{xA - xp}\right) \quad \text{[Mathematical Expression 5]}$$

$$\phi 1B = \tan^{-1}\left(\frac{yB - yp}{xB - xp}\right) \quad \text{[Mathematical Expression 6]}$$

In Mathematical Expression 4, as shown in FIG. 9, the direction of a perpendicular Z extending from the point light source P to the back surface 1r is the direction where θ=0 is established; the angle θ in the case of the light emitted from the point light source P in a (θ, φ) direction, thereafter totally reflected by a point R in the back surface 1r and arriving at a point M on a line segment A' B' forms an angle θ1; and the greater one of θ1 and the critical angle θc is θx. The light output in a range between a (θ1, φ) direction and a (θx, φ) direction is the upward output light Lu, and therefore such a range is excluded from the range of integration in Mathematical Expression 4.

A distance Lm between the point light source P and an intersection point R' of a perpendicular extending from the point R to the front surface 1t and the front surface 1t is obtained by the following Mathematical Expression 7, and the angle θ1 is obtained by the following Mathematical Expression 8. T in Mathematical Expression 8 is the thickness of the sapphire substrate 1.

$$Lm = \frac{xA - xP}{2\cos\phi} \quad \text{[Mathematical Expression 7]}$$

$$\theta 1 = \tan^{-1}\left(\frac{Lm}{T}\right) \quad \text{[Mathematical Expression 8]}$$

From the foregoing, θ1 serves as a function θ1(φ) of φ, and the magnitude relationship between θ1(φ) and θc changes depending on the value of φ. Therefore, in the definite integral of Mathematical Expression 4, θx=θ1(φ) when θ1(φ)>θc, and θx=θc when θ1(φ)≤θc.

The light outputs Qs2 to Qs4 respectively passing through other three side surfaces 1s2 to 1s4 can be calculated in the manner similar to the light output Qs1, by successively changing the apexes A and B to the apexes B and C, to the apexes C and D, and to the apexes D and A. Specifically, Mathematical Expression 4 can be converted for the light outputs Qs2 to Qs4 by: rotating the direction where φ=0 is established (the +x direction) by 90 degrees; converting the xy coordinate values of the point light source P and the apexes A to D; replacing (φ1A, φ1B) in Mathematical Expressions 4 to 6 by (φ2B, φ2C), by (φ3C, φ3D), and by (φ4D, φ4A); and similarly changing Lm in Mathematical Expression 7. Hence, the methods for calculating the light outputs Qs2 to Qs4 are basically similar to that for calculating the light output Qs1, and therefore a repetitive description is omitted.

From the foregoing, a total light output Qus that is output from the point light source P and transmits through the sapphire substrate 1 to be extracted to the outside of the chip can be calculated as the sum of the light output sum Qs of the first and second sideways output light Ls1 and Ls2 calculated in the foregoing and the light output Qu of the upward output light Lu.

Figure 10:
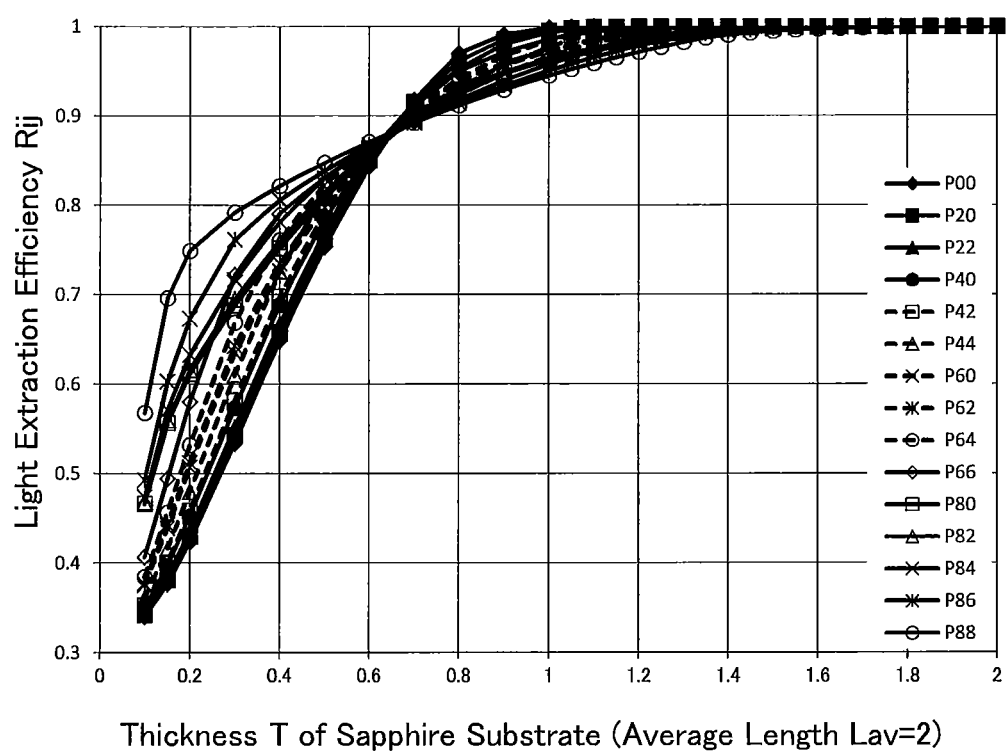
FIG. 10 is a diagram showing the relationship between light extraction efficiency Rij of 15 point light sources Pij at the sapphire substrate of Example 1 and a thickness T of the sapphire substrate.
Figure 11:
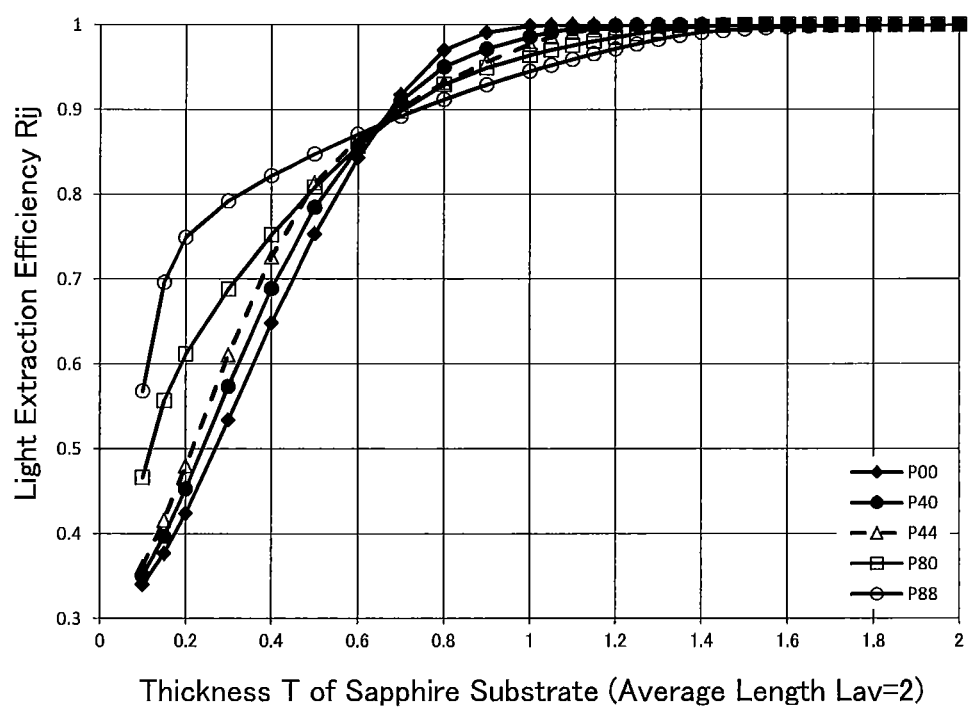
FIG. 11 is a diagram showing the relationship between the light extraction efficiency Rij of selected 5 point light sources Pij at the sapphire substrate of Example 1 and the thickness T of the sapphire substrate.
Figure 12:
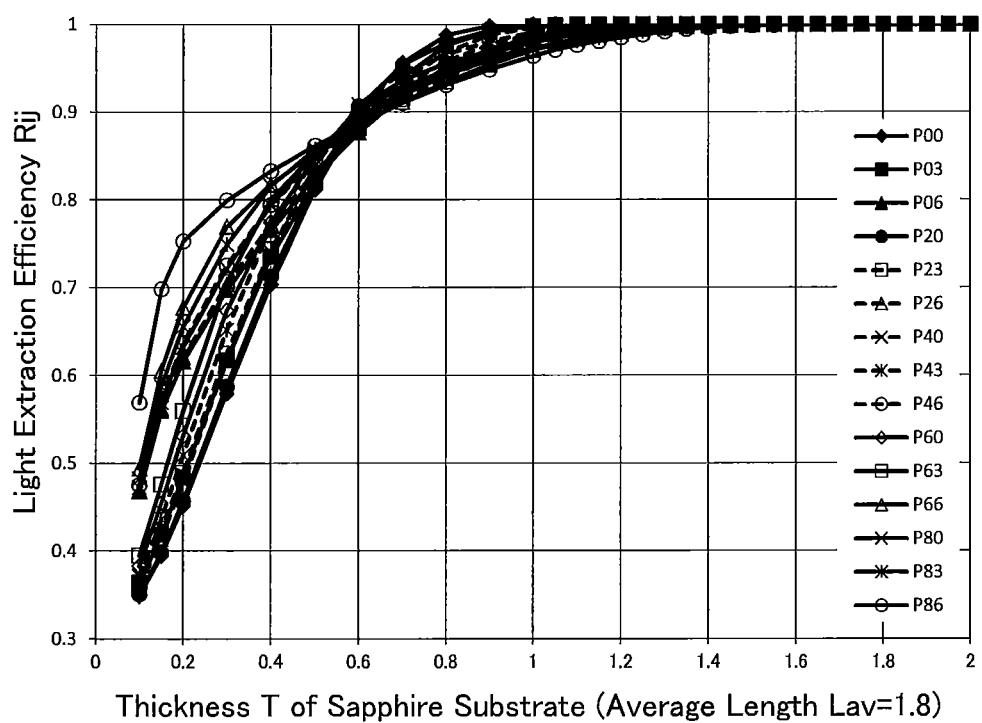
FIG. 12 is a diagram showing the relationship between the light extraction efficiency Rij of selected 15 point light sources Pij at the sapphire substrate of Example 2 and the thickness T of the sapphire substrate.
Figure 13:
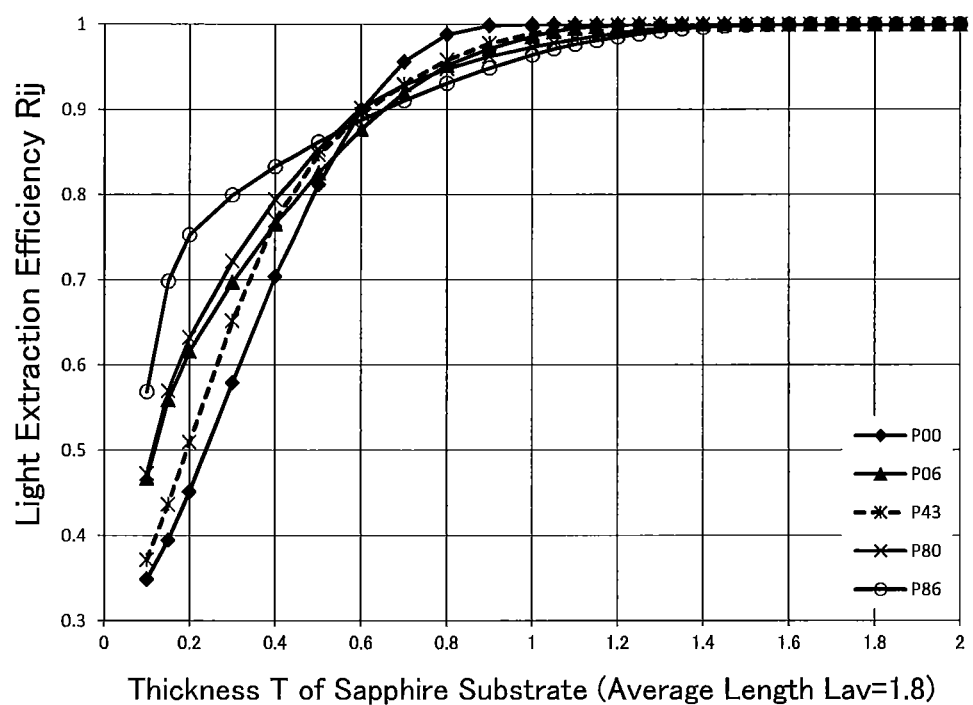
FIG. 13 is a diagram showing the relationship between the light extraction efficiency Rij of selected 5 point light sources Pij at the sapphire substrate of Example 2 and the thickness T of the sapphire substrate.

FIGS. 10 to 13 show the calculation results of the total light output Qus calculated for the 15 point light sources Pij with the square chip of Example 1 and the rectangular chip of Example 2. In FIGS. 10 to 13, the horizontal axis indicates the thickness T of the sapphire substrate 1, and the vertical axis indicates light extraction efficiency Rij, which is obtained by dividing the total light output Qus of each point light source Pij by the light output Qall of the entire output light. FIG. 10 shows all the calculation results of all the 15 point light sources Pij of Example 1. FIG. 11 shows the calculation results of selected 5 point light sources P00, P40, P44, P80, and P88 of Example 1. FIG. 12 shows the calculation results of all the 15 point light sources Pij of Example 2. FIG. 13 shows the calculation results of selected 5 point light sources P00, P06, P43, P80, and P86 of Example 2.

From FIGS. 10 and 12, it can be seen that the light extraction efficiency Rij of the point light source Pij changes depending on the position of the point light source Pij with both of the square chip and the rectangular chip. However, it can be seen that, with any point light source Pij, the light extraction efficiency Rij increases as the thickness T of the sapphire substrate 1 is greater, and ultimately converges to 1.

FIGS. 11 and 13 more clearly show the detail of the difference in the light extraction efficiency Rij by the position of the point light source Pij. With the square chip of Example 1, when the thickness T is about 0.65 or less, higher light extraction efficiency Rij is obtained with a point light source P nearer to the periphery of the chip than with a point light source P nearer to the center of the chip. On the other hand, when the thickness T is about 0.65 or greater, higher light extraction efficiency Rij is obtained with a point light source P nearer to the center of the chip than with a point light source P nearer to the periphery of the chip. With the rectangular chip of Example 2, when the thickness T is about 0.58 or less, higher light extraction efficiency Rij is obtained with a point light source P nearer to the periphery of the chip than with a point light source P nearer to the center of the chip. On the other hand, when the thickness T is about 0.58 or greater, higher light extraction efficiency Rij is obtained with a point light source P nearer to the center of the chip than with a point light source P nearer to the periphery of the chip.

This is explained as follows. Since a point light source P nearer to the periphery of the chip is in close proximity to one or two of the four side surfaces 1s of the sapphire substrate 1, a reduction in the light output from the one or two side surfaces 1s out of the light output sum Qs of the first and second sideways output light Ls1 and Ls2 is not significant relative to a reduction in the thickness T of the sapphire substrate 1. Further, when the square chip of Example 1 and the rectangular chip of Example 2 are compared against each other, it can be seen that the light output Qs is greater with the rectangular chip even when the chips have an identical thickness, because a point light source P nearer to the periphery of the short side of the chip tends to be in close proximity to the two side surfaces 1s.

The total light output Qus of each point light source Pij can be regarded as the average value of the light output of a small-section surface light source Sij measuring 0.2×0.2 about each point light source Pij. Accordingly, a group of the total light outputs Qus of the point light sources Pij is a light output QSus of the surface light source S. Here, by calculating a weighted average value of the light extraction efficiency Rij of each point light source Pij while taking into consideration of the symmetry of the disposition of the discrete 15 point light sources Pij within a chip, the approximate value of the light extraction efficiency from the surface light source S can be obtained. In the present embodiment, defining the light extraction efficiency of the point light sources Pij as Rij, light extraction efficiency RS1 from the surface light source S from the square chip of Example 1 is calculated from the following Mathematical Expression 9, and light extraction efficiency RS2 from the surface light source S of the rectangular chip of Example 2 is calculated from the following Mathematical Expression 10. The coefficient of the weighted average is a value with the assumption that the point light sources are evenly discretely disposed in the x and y directions at a 0.2 interval. In Example 2, for example, a point light source P23 represents two point light sources P22 and P24 at xy coordinates (0.2, 0.2) and (0.2, 0.4).

$$RS1=(R00+4(R20+R22+R40+R44+R60+R66+R80+R88)+8(R42+R62+R64+R82+R84+R86))/81 \quad \text{[Mathematical Expression 9]}$$

$$RS2=(R00+2(R06+R20+R40+R60+R80)+4(R03+R26+R46+R66+R86)+8(R23+R43+R63+R83))/63 \quad \text{[Mathematical Expression 10]}$$

Figure 14:
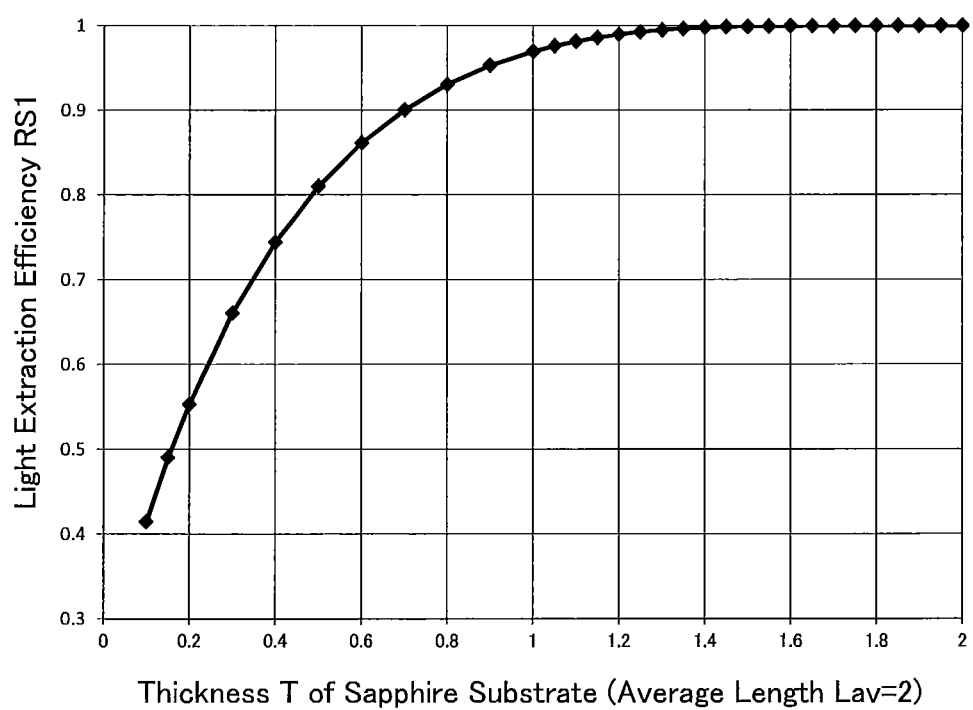
FIG. 14 is a diagram showing the relationship between light extraction efficiency RS1 from a surface light source S at the sapphire substrate of Example 1 and the thickness T of the sapphire substrate.
Figure 15:
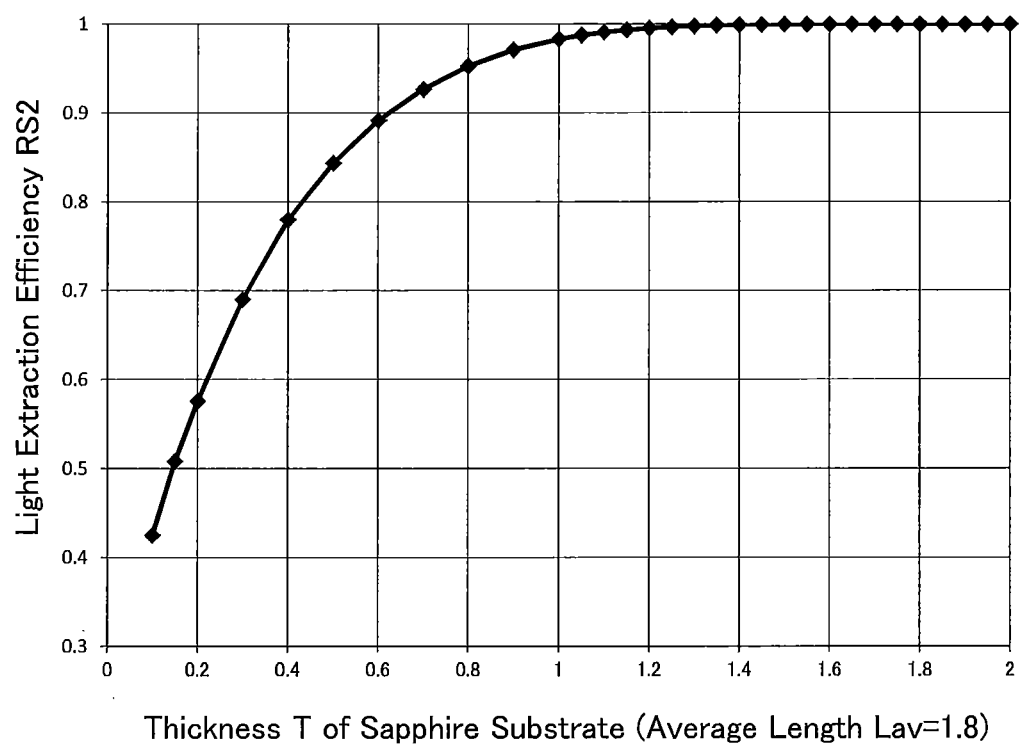
FIG. 15 is a diagram showing the relationship between light extraction efficiency RS2 from a surface light source S at the sapphire substrate of Example 2 and the thickness T of the sapphire substrate.

FIG. 14 shows the light extraction efficiency RS1 from the surface light source S of the square chip of Example 1. FIG. 15 shows the light extraction efficiency RS2 from the surface light source S of the rectangular chip of Example 2. The horizontal axis indicates the thickness T of the sapphire substrate 1, and the vertical axis indicates the light extraction efficiency RS1 and RS2.

FIG. 14 shows that, with the square chip of Example 1, the light extraction efficiency RS1 of 0.953 or greater is obtained with a thickness T of 0.9 or greater, and the light extraction efficiency RS1 of 0.970 or greater is obtained with a thickness T of 1 or greater. Further, the light extraction efficiency RS1 converges to 0.9997 (approximately 1) with a thickness T of 1.6, and the light extraction efficiency RS1 completely converges to 1 with a thickness T of 1.95. Light extraction efficiency R00 of a point light source P00 at the center O of the chip provides 0.991 or greater with a thickness T of 0.9 or greater, and provides 0.999 or greater with a thickness T of 1 or greater. With all things considered, it can be determined that the light extraction efficiency sufficiently improves with a thickness T of 0.9 or greater. Further, an improvement in the light extraction efficiency can be fully achieved with a thickness T of 1 or greater. Since the light extraction efficiency RS1 completely converges to 1 with a thickness T of 1.95, there is no advantage in increasing the thickness T to be greater than 2 even when an error is taken into consideration. Virtually, a thickness T of 1.6 or less will suffice.

FIG. 15 shows that, with the rectangular chip of Example 2, the light extraction efficiency RS2 of 0.953 or greater is obtained with a thickness T of 0.8 or greater and the light extraction efficiency RS2 of 0.971 is obtained with a thickness T of 0.9 or greater. Further, the light extraction efficiency RS2 converges to 0.9997 (approximately 1) with a thickness T of 1.45, and the light extraction efficiency RS2 completely converges to 1 with a thickness T of 1.7. Light extraction efficiency R00 of a point light source P00 at the center O of the chip provides 0.988 or greater with a thickness T of 0.8 or greater, and provides 0.999 or greater with a thickness T of 0.9 or greater. With all things considered, it can be determined that the light extraction efficiency sufficiently improves with a thickness T of 0.8 or greater. Further, an improvement in the light extraction efficiency can be fully achieved with a thickness T of 0.9 or greater. Since the light extraction efficiency RS2 completely converges to 1 with a thickness T of 1.7, there is no advantage in increasing the thickness T to be greater than 1.8. Virtually, a thickness T of 1.45 or less will suffice.

As described above, based on the calculation results of the light extraction efficiency RS1 and RS2 of the square chip of Example 1 and the rectangular chip of Example 2 shown in FIGS. 14 and 15, respectively, in both the cases where the chip has a square planarly-viewed shape and where the chip has a rectangular planarly-viewed shape, the thickness T of the sapphire substrate 1 is preferably 0.45 to 1 times the average length Lav of the sides of the planarly-viewed shape of the chip. Further preferably, the thickness T is 0.5 to 1 times the average length Lav, or 0.45 to 0.8 times the average length Lav, and still further preferably 0.5 to 0.8 times the average length Lav.

Further, when the chip area is the same, the average length Lav is shorter with the square chip than with the rectangular chip. Accordingly, the thickness T of the sapphire substrate 1 which provides the same light extraction efficiency is smaller with the square chip.

Meanwhile, the calculation results of the light extraction efficiency RS1 and RS2 shown in FIGS. 14 and 15 are on the assumption that the surface light source S covers about 80% of the entire surface of the chip. On the other hand, with an actual chip, the planarly-viewed pattern of the active layer (the first region R1) may be comb-shaped as shown in FIG. 5, or may be more localized at the center of the chip. However, with such planarly-viewed patterns, out of the above-described 15 point light sources Pij, those existing at the periphery of the chip are small in number. Therefore, in a range where the proportion of the thickness T relative to the average length Lav is greater than 0.33, it is considered that the light extraction efficiency RS1 and RS2 further improves. That is, it can be said that the calculation results of the light extraction efficiency RS1 and RS2 shown in FIGS. 14 and 15 show the worst case for the active layer that may have various planarly-viewed patterns.

Next, a description will be given of two types of experiment results that verify that the light extraction efficiency from the surface light source S sufficiently improves when the thickness T of the sapphire substrate 1 is 0.45 to 1 times the average length Lav of the sides of the planarly-viewed shape of the chip.

Figure 16:
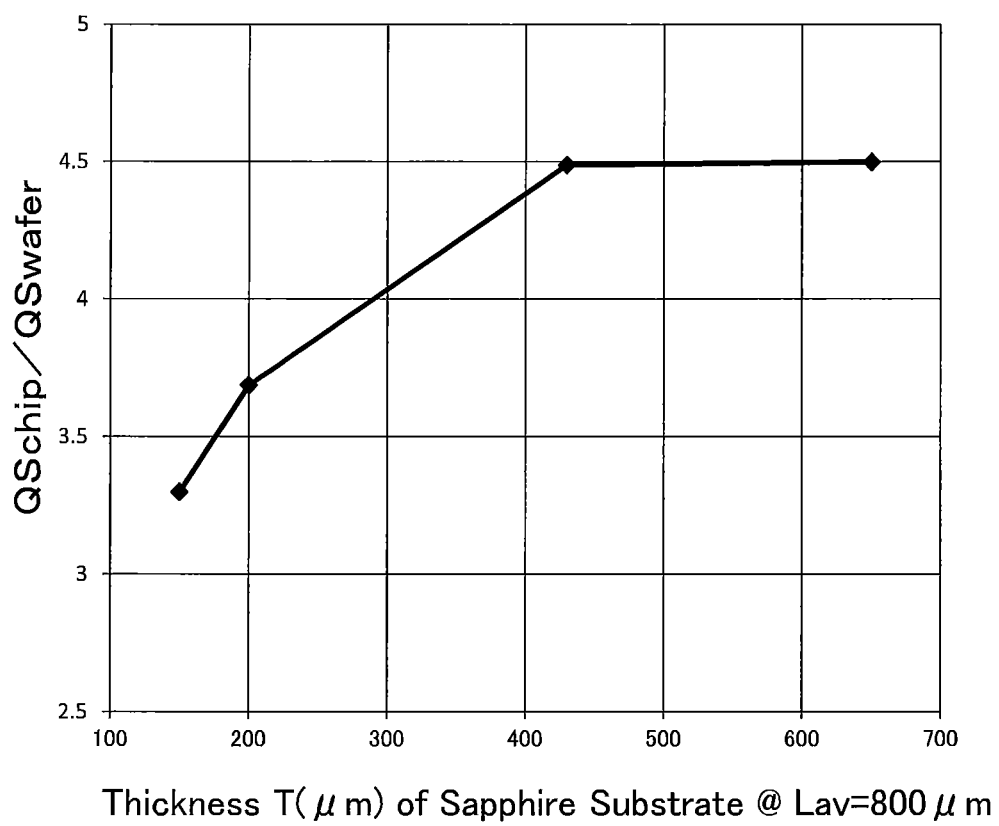
FIG. 16 is a diagram showing the relationship between a light output proportion, which is obtained through measurement as a wafer and as a chip, and the thickness of the sapphire substrate.

The first experiment result was obtained by: measuring a light output QSwafer of a light emitting element (LED) as a wafer before having its thickness reduced; dicing the wafer having its thickness reduced into chips; again measuring a light output QSchip; and calculating a light output proportion (QSchip/QSwafer). The sample used in the experiment was an LED of the planarly-viewed pattern exemplarily shown in FIG. 5, having a chip size of 800 µm square as a result of dicing. The thickness T of the sapphire substrate having its thickness reduced was four types, namely, 150 µm, 200 µm, 430 µm, and 650 µm. The light output QSwafer was measured using an integrating-sphere photometer at forward current 20 mA, and the light output QSchip was measured using the integrating-sphere photometer at forward current 60 mA. FIG. 16 shows the calculation result.

The proportions (T/Lav) of the four types of thickness T relative to the chip size 800 µm (the average length Lav=800 µm) are 0.1875, 0.25, 0.5375, and 0.8125, respectively. Note that, the maximum value of the light output proportion (QSchip/QSwafer) being greater than 1 and about 4.5 times is explained as follows: as a wafer, the light that can be extracted to the outside of the chip is limited to the upward output light Lu and light cannot be extracted from the side surfaces of the sapphire substrate, and therefore the light extraction efficiency is limited to about 30%, which is the proportion of the light output Qu of the upward output light Lu relative to the light output Qall of the entire output light; not all the light extracted to the outside of the chip is captured by the integrating-sphere photometer when the light output QSwafer is measured; and the light extraction efficiency as a wafer is limited to about 20% to 25% by the difference in forward current and the like.

In the result shown in FIG. 16, when the proportions (T/Lav) are 0.1875, 0.25, 0.5375, and 0.8125, the light output proportions (QSchip/QSwafer) are 3.3, 3.68, 4.5, and 4.5. Accordingly, when T/Lav is 0.5375 or greater, the light output proportion (QSchip/QSwafer) is already saturated at about 4.5. Here, when the light output proportion (QSchip/QSwafer) is normalized with the saturation value, the normalized light output proportions are 0.73, 0.82, 1, and 1.

On the other hand, in the calculation result shown in FIG. 14, when the thicknesses T are 0.3, 0.5, 1, and 1.6, the proportions (T/Lav) are 0.1875, 0.25, 0.5, and 0.8, respectively, and the values of the light extraction efficiency RS1 with the thicknesses T are 0.66, 0.81, 0.97, and 1.00, respectively. From the foregoing, it can be said that the light output proportion (QSchip/QSwafer) of the experiment result shown in FIG. 16 and the calculation result of the light extraction efficiency RS1 of the square chip of Example 1 shown in FIG. 14 exactly agree with each other.

The second experiment result was obtained by an experiment verifying the light extraction proportion from the side surfaces of the sapphire substrate. The result was obtained by; measuring a light output QS0 of three LED samples each having the planarly-viewed pattern exemplarily shown in FIG. 5 and having a chip size of 800 µm square as a result of dicing, with the thickness T of the sapphire substrate being 430 µm; applying grease to the four side surfaces of the sapphire substrate for the light output from each side surface to be absorbed by the grease; again measuring a light output QS1; and calculating a side surface proportion (QS0−QS1)/QS0. The light outputs QS0 of the samples were 3.33 mW, 3.05 mW, and 3.05 mW, whereas the corresponding light outputs QS1 were reduced to 0.97, 0.61, and 0.68. As a result, the side surface proportions (QS0−QS1)/QS0 were calculated as 0.71, 0.80, and 0.78. From the foregoing, it is found that the light extraction proportion from the side surfaces is as great as 70% to 80% when the thickness of the sapphire substrate is sufficiently thick. As described above, while the proportion of the light output Qu of the upward output light Lu relative to the light output Qall of the whole output light is about 30%, part of the light includes light that directly arrives at the side surfaces. Accordingly, it agrees with the result showing that the light extraction proportion from the side surfaces is 70% to 80%.

From the two experiment results described above, it is verified that the calculation results of the light extraction efficiency RS1 of the square chip of Example 1 shown in FIG. 14 and the light extraction efficiency RS2 of the rectangular chip of Example 2 shown in FIG. 15 pose no problems in practice.

Figure 17:
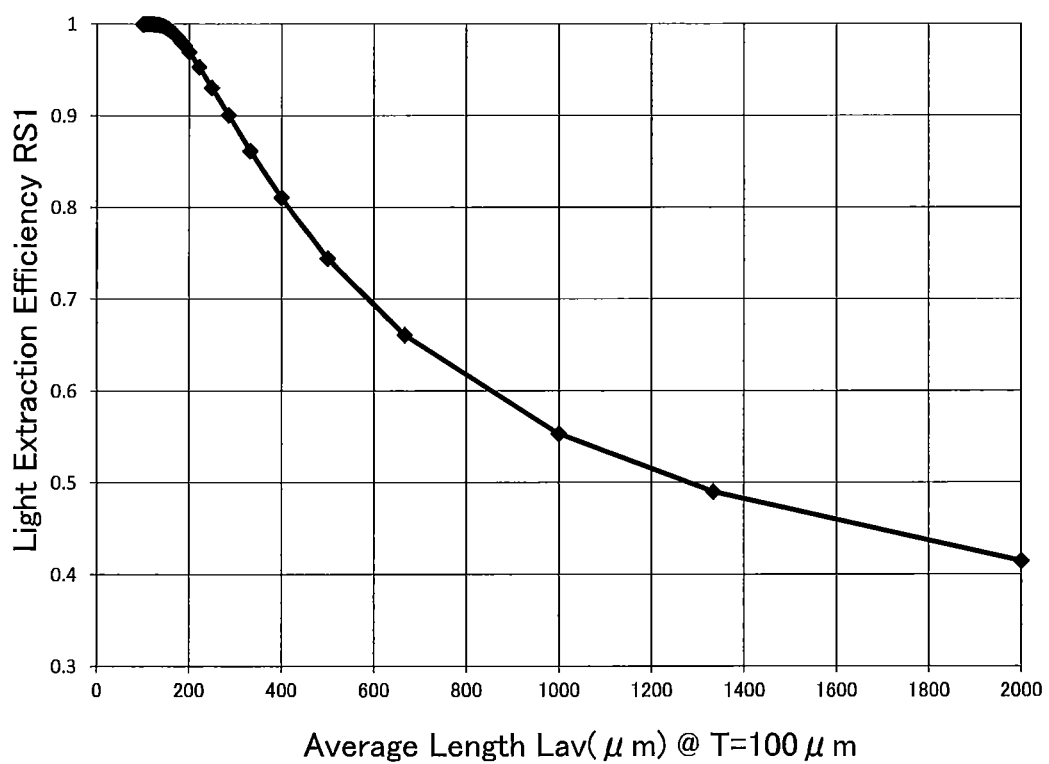
FIG. 17 is a diagram showing the relationship between the chip size and the light extraction efficiency RS1 in the case where the thickness T of the sapphire substrate is 100 μm.

As has been described in Background art, in the field of nitride semiconductor light emitting elements, generally the thickness T of the sapphire substrate is about 100 µm. Hence, in the case where the thickness T of the sapphire substrate is fixed to 100 µm, how the light extraction efficiency RS1 is reduced by an increase in the chip size of a square chip is calculated from the calculation result of the light extraction efficiency RS1 shown in FIG. 14. FIG. 17 shows the result.

As shown in FIG. 17, when the chip size is 400 µm, the light extraction efficiency RS1 reduces to 0.81; when the chip size is 500 µm, the light extraction efficiency RS1 reduces to 0.74; when the chip size is 667 µm, the light extraction efficiency RS1 reduces to 0.66; when the chip size is 1000 µm, the light extraction efficiency RS1 reduces to 0.55; and when the chip size is 2000 µm, the light extraction efficiency RS1 reduces to 0.41. As in the conventional manner, when the thickness T of the sapphire substrate is set to about 100 µm with the light extraction from the side surfaces of the sapphire substrate being ignored, an increase in the chip size, that is, an increase in the efficiency and output of the light emitting element cannot be achieved. Accordingly, the thickness T of the sapphire substrate must be optimized depending on the chip size. Here, it is preferable to set the thickness T to be 0.45 to 1 times the average length Lav of the sides of the planarly-viewed shape of the chip. Further, the advantage of setting the thickness T of the sapphire substrate with reference to the average length Lav in this manner is significant when the average length Lav is, for example, 400 µm or greater, and this advantage becomes more significant as the average length Lav becomes further greater. Though the average length Lav is not limited to a specific value, the case where the average length Lav is 400 µm or greater, and particularly 500 µm or greater is assumed in the present embodiment.

INDUSTRIAL APPLICABILITY

When the nitride semiconductor light emitting element of the present invention is applied to a back-surface-emitting type nitride semiconductor light emitting element in which light emitted from the active layer is output to the outside of the element through the sapphire substrate, an improvement in the efficiency of light extraction is achieved.

DESCRIPTION OF SYMBOLS

100: Nitride semiconductor light emitting element
1: Sapphire substrate
1r: Back surface of the sapphire substrate
1s: Side surface of the sapphire substrate
1t: Front surface of the sapphire substrate
2: Light emitting element structure
3: N-type clad layer
4: Active layer
4a: Barrier layer
4b: Well layer
5: P-type clad layer
6: Base layer structure
6a: AlN layer
6b: AlGaN layer
7: Electron block layer
8: P-type contact layer
9: Light emitting laminated structure 10: P-type electrode
11: N-type electrode
20: Submount
21: Base material
22: First metal electrode wiring
23: Second metal electrode wiring
24, 25: Lead terminal
26: Bump
P: Point light source
S: Surface light source
R1: First region
R2: Second region

What is claimed is:

1. A nitride semiconductor light emitting element comprising:
    a sapphire substrate; and
    a light emitting element structure portion that has a plurality of nitride semiconductor layers formed on the sapphire substrate,
    wherein
    the nitride semiconductor light emitting element is a back-surface-emitting type nitride semiconductor light emitting element that outputs light from the light emitting element structure portion to an outside of the element through the sapphire substrate, the nitride semiconductor light emitting element being divided into a chip whose planarly-viewed shape is a square or a rectangle,
    an average length of sides of the planarly-viewed shape of the chip is 400 μm or greater, and
    a thickness of the sapphire substrate is 0.45 to 1 times the average length.

2. The nitride semiconductor light emitting element according to claim 1, wherein
    the light emitting element structure portion includes:
        a base structure portion that includes an AlGaN-based semiconductor layer formed on the sapphire substrate; and
        a light emitting laminated portion formed on a crystal surface of the base structure portion, the light emitting laminated portion including an n-type clad layer being an n-type AlGaN-based semiconductor layer, an active layer having an AlGaN-based semiconductor layer, and a p-type clad layer being a p-type AlGaN-based semiconductor layer.

3. The nitride semiconductor light emitting element according to claim 1, wherein the thickness of the sapphire substrate is 0.5 times or greater the average length.

4. The nitride semiconductor light emitting element according to claim 1, wherein the thickness of the sapphire substrate is 0.8 times or less the average length.

5. The nitride semiconductor light emitting element according to claim 1, wherein the chip is obtained from a wafer being divided by stealth dicing.

6. The nitride semiconductor light emitting element according to claim 1, wherein the average length is 500 μm or greater.

7. A method for manufacturing a nitride semiconductor light emitting element, the method comprising:
    forming a light emitting element structure portion having a plurality of nitride semiconductor layers on a sapphire substrate as a wafer having a first thickness;
    polishing a back surface of the sapphire substrate as the wafer on which the light emitting element structure portion is formed, so as to reduce a thickness of the sapphire substrate to a second thickness being smaller than the first thickness; and
    dividing the wafer in which the light emitting element structure portion is formed on the sapphire substrate having its thickness reduced into a chip of a nitride semiconductor light emitting element whose planarly-viewed shape is a square or a rectangle,
    wherein
    the nitride semiconductor light emitting element is a back-surface-emitting type light emitting element that outputs light emitted from the light emitting element structure portion to an outside of the element through the sapphire substrate,
    an average length of sides of the planarly-viewed shape of the nitride semiconductor light emitting element is 400 μm or greater, and
    the second thickness is 0.45 to 1 times the average length.

8. The method for manufacturing the nitride semiconductor light emitting element according to claim 7, wherein
    the forming the light emitting element structure portion includes:
        forming a base structure portion including an AlGaN-based semiconductor layer on the sapphire substrate as the wafer having the first thickness; and
        forming, on a crystal surface of the base structure portion, a light emitting laminated portion that includes an n-type clad layer being an n-type AlGaN-based semiconductor layer, an active layer having an AlGaN-based semiconductor layer, and a p-type clad layer being a p-type AlGaN-based semiconductor layer.

9. The method for manufacturing the nitride semiconductor light emitting element according to claim 7, wherein, in the dividing the wafer into the chip, stealth dicing is performed.

10. The method for manufacturing the nitride semiconductor light emitting element according to claim 9, wherein, in the performing the stealth dicing, a plurality of focal points of a laser beam used in the stealth dicing are set in a thickness direction of the sapphire substrate.

* * * * *